United States Patent [19]

Takagi et al.

[11] 4,178,585
[45] Dec. 11, 1979

[54] ANALOG-TO-DIGITAL CONVERTER

[75] Inventors: Katsuaki Takagi; Toshiro Tsukada, both of Kokubunji; Hisashi Tsuruoka, Hachioji; Michio Hara, Kodaira, all of Japan

[73] Assignee: Hitachi, Ltd., Japan

[21] Appl. No.: 935,963

[22] Filed: Aug. 22, 1978

[30] Foreign Application Priority Data

Aug. 29, 1977 [JP] Japan ................................ 52/102710

[51] Int. Cl.² ............................................ H03K 13/20
[52] U.S. Cl. ........................ 340/347 NT; 340/347 AD
[58] Field of Search ................. 340/347 NT, 347 AD, 340/347 DA; 307/301; 324/99 D

[56] References Cited
U.S. PATENT DOCUMENTS 3,480,948  11/1969  Lord .............................. 340/347 NT
4,023,160  5/1977  Kirschner ...................... 340/347 NT

OTHER PUBLICATIONS

Duke, "IEEE Transactions on Instrumentation and Measurement" Feb. 1971, pp. 74-76.

Primary Examiner—Charles D. Miller
Attorney, Agent, or Firm—Craig and Antonelli

[57] ABSTRACT

An analog-to-digital converter comprising a capacitor for storing an analog input signal, a constant current discharging circuit coupled with the capacitor for discharging the charge stored therein, a level detection circuit connected to the input terminal of the capacitor, a counter connected to the output terminal of the level detection circuit for counting the number of clockpulses between the time of discharge start and the time when the voltage at the input terminal of the capacitor drops to a detection level of the level detection circuit, a bias voltage supply means connected in series with the capacitor for adding a bias voltage to the voltage at the input terminal of said capacitor, and a switch connected in parallel with the capacitor for short-circuiting the capacitor when the voltage at the input terminal of said capacitor drops to the detection level.

12 Claims, 9 Drawing Figures

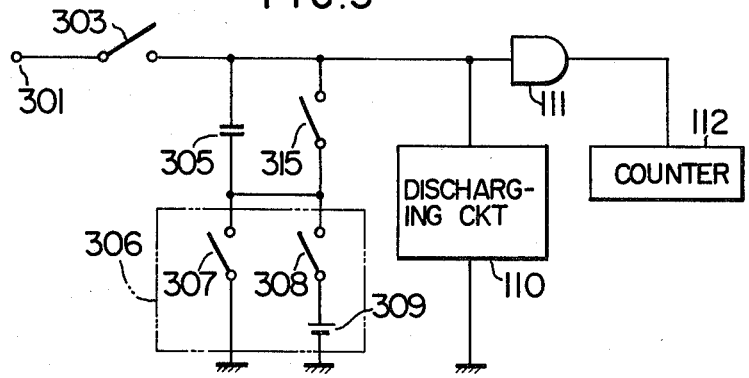
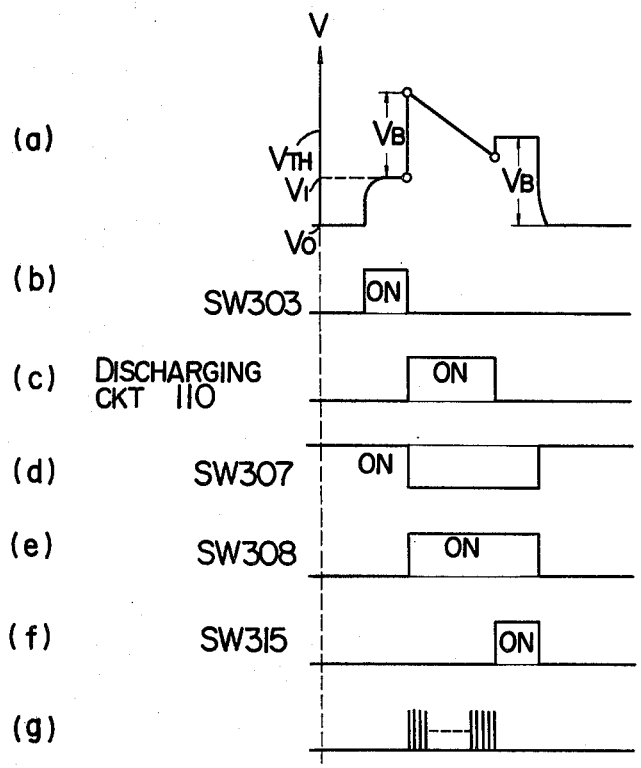

ANALOG-TO-DIGITAL CONVERTER

BACKGROUND OF THE INVENTION

1. Field of the Invention

This invention relates to an analog-to-digital converter (hereinafter referred to as an ADC), and more particularly to an integrated ADC as used in the field of welfare electric equipments, home electric apparatus, etc.

2. Description of the Prior Art

In a prior art, an ADC comprises an input terminal to which an analog input signal is applied, a capacitor connected to the input terminal through a switch, for storing the analog input signal, a discharging circuit for discharging the charge stored in the capacitor, a level detection circuit connected to the input terminal of the capacitor and a counter connected to the output terminal of the level detection circuit for counting the number of clock pulses. An example of the prior ADC is shown in G. Smarandoin, et al. "An All MOS Analog to Digital Converter Using a Constant Slope Approach", IEEE Journal of Solid-State Circuits, June 1976.

In this ADC, however, if an input signal voltage is lower than the detection level voltage $V_{TH}$, the discharge time T cannot be detected, so that an analog to digital conversion (called A-D conversion hereinafter) is not performed.

In order to perform the A-D conversion over a wide range of the input signal, some of the inventors of this invention previously developed a new type ADC, for which a patent application was filed as U.S. patent application Ser. No. 887,966 on Mar. 20, 1978. The above new type ADC has a bias voltage supply means connected to the capacitive element, which shifts the potential at the input terminal of the capacitor during the discharge time T.

But, in this circuit, when the bias voltage $V_B$ is larger than the detection level voltage $V_{TH}$ and the potential of the output terminal of the capacitor changes from the bias voltage $V_B$ to the ground voltage, a negative voltage (generally reverse polarity of the input signal one) is produced on the input terminal of the capacitor. Therefore, if the new type ADC is constructed with n-channel MOSIC, the circuit may be broken or may have an extraordinary action.

SUMMARY OF THE INVENTION

An object of this invention is to provide an analog to digital converter wherein an input level can be converted over a wide range.

Another object of this invention is to provide an analog to digital converter which is suitable for the formation of an IC.

In order to achieve the above objects, an ADC of the present invention comprises a storage means with an input terminal for storing an analog input signal which is applied to the input terminal, a discharging circuit coupled with the storage means for discharging the charge stored in said storage means, a level detection means connected to the input terminal of said storage means for detecting the time when a voltage at the input terminal of said storage means becomes equal to a detection level, a counter means for counting the number of clock pulses, a bias supply means connected in series with said storage means for shifting the voltage at said input terminal of said storage means above said detection level, and a short-circuiting means connected in parallel with said storage means for short-circuiting said storage means.

According to the ADC of this invention, the measurement of a very small input signal voltage or the A-D conversion of such an input signal becomes possible, even if the input signal voltage is below the detection level. Moreover, no negative voltage is generated in any part of the circuit, regardless of the magnitude of the bias voltage.

BRIEF DESCRIPTION OF THE DRAWINGS

FIG. 3 shows a schematic circuit of an embodiment of this invention.

FIG. 4 shows waveform diagrams for explaining the operation of the circuit shown in FIG. 3.

DESCRIPTION OF THE PREFERRED EMBODIMENT

Prior to a detailed description of this invention, the construction and the operation of a conventional ADC will be explained with FIGS. 1 and 2.

Figure 1:
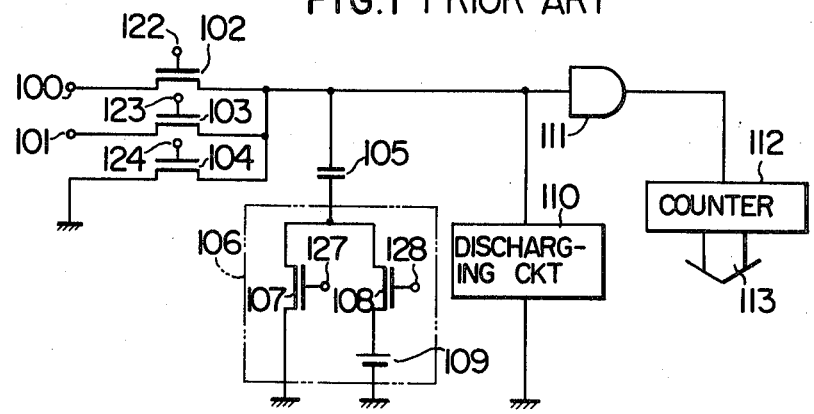
FIG. 1 shows a schematic construction of a prior art ADC of U.S. patent application Ser. No. 887,966.

Referring to FIG. 1, reference numerals 101 and 100 denote input terminals, to which an analog input signal and a reference voltage are applied, respectively. As will be described later, the reference voltage together with the ground voltage is used to eliminate any influence of the circuit component elements upon the value of a digital signal corresponding to an analog input signal. Reference numerals 102, 103 and 104 denote switches for applying to a capacitor 105 the reference voltage, analog input signal and ground voltage, respectively. A bias voltage supply means generally denoted by 106 functions to connect a bias voltage $V_B$ to the capacitor 105 and includes a switch 107, a switch 108 and a bias voltage source 109. Reference numeral 110 denotes a discharging circuit for discharging the charge stored in the capacitor 105. The discharging circuit 110 is of a constant current type. Reference numeral 111 denotes a level detecting circuit for detecting the time when a voltage at the input terminal of the capacitor 105 reaches a predetermined value, and 112 a counter. The counter 112 counts up clock pulses for the time ranging from the initiation of discharging the capacitor 105 to a time representative of the predetermined value of the capacitor input terminal voltage and delivers the number of the counted clock pulses. Reference numeral 113 denotes the output of the counter 112. Generally, this output 113 is sent to a processor circuit (not shown as having no direct relation to this invention).

Figure 2:
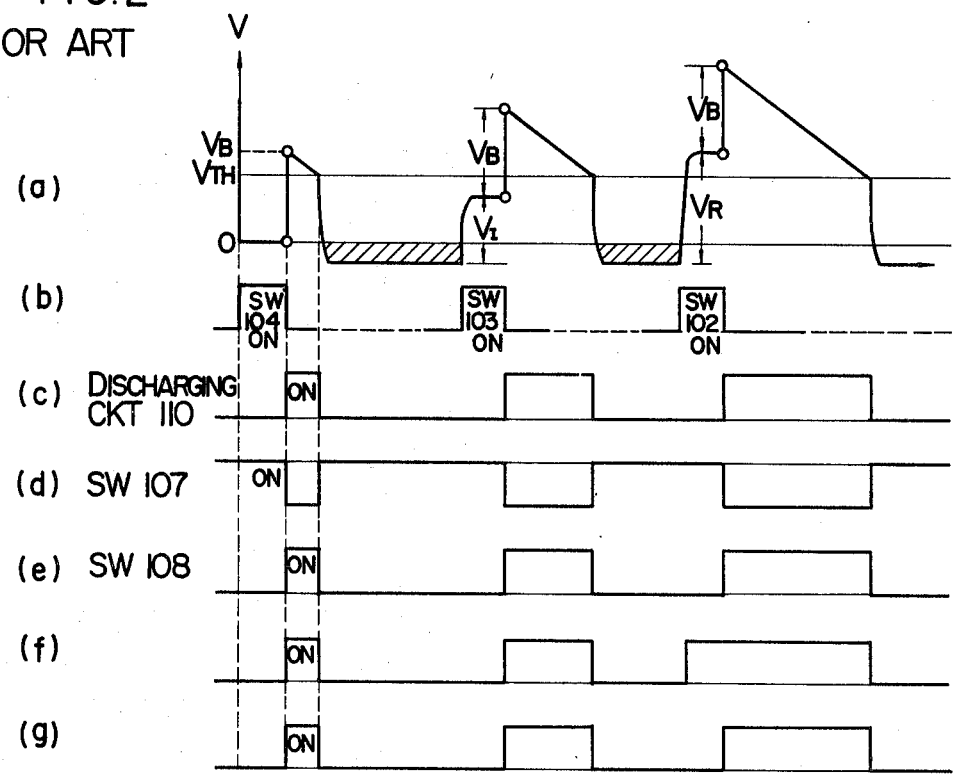
FIG. 2 shows waveform diagrams for explaining the operation of the circuit shown in FIG. 1.

Referring to FIG. 2, an operational description will be given herein of the ADC shown in FIG. 1. FIG. 2(a) illustrates an input terminal voltage V of the capacitor 105, FIG. 2(b) illustrates pulses applied to the gate terminals 124, 123 and 122 of the respective switches 104, 103 and 102, FIG. 2(c) illustrates the operation period of the discharging circuit 110, FIG. 2(d) illustrates pulses applied to the gate terminal 127 of the switch 107, FIG. 2(e) illustrates pulses applied to the gate terminal 128 of the switch 108 for connecting the bias voltage $V_B$ to the capacitor 105, FIG. 2(f) illustrates the output signal of the level detection circuit 111, and FIG. 2(g) illustrates the counting period of the counter 112.

Consider the storage of the analog input signal received at the input terminal 101 into the capacitor 105 when the switch 103 is turned on as shown in FIG. 2(b). During this storage period, the switch 107 in the bias voltage supply means 106 maintains its ON state as shown in FIG. 2(d) so that the other end (not input terminal) of the capacitor 105 is grounded. Since the switch 103 maintains its ON state for a predetermined period, the capacitor 105 will be saturated with a voltage value $V_I$ of the analog input signal as shown in FIG. 2(a). Subsequently, as the switches 103 and 107 are turned off and the discharging circuit 110 and switch 108 are turned on, the input terminal voltage V of the capacitor 105 rises up to $(V_I + V_B)$, initiating the simultaneous discharging of the capacitor 15. The input terminal voltage V of the capacitor 105 then decreases gradually until it reaches a detection level voltage $V_{TH}$ of the level detection circuit 111 with simultaneous turning off of the discharging circuit 110 and switch 108 as well as simultaneous turning on of the switch 107. As a result, for a period ranging from the initiation of operation of the discharging circuit 110 to the arrival of input terminal voltage V at the detection level voltage $V_{TH}$ determined by the level detection circuit 111, as shown in FIG. 2(g), the counter 112 counts up clock pulses to complete the A-D conversion of the analog input signal.

It is to be noted that FIG. 1 is not illustrative of a control circuit for the switches 103, 107 and 108, discharging circuit 110 and counter 112. It is also to be noted that the detection level voltage $V_{TH}$ of level detection circuit 111 has been preset in compliance with the voltage range of analog input signal $V_I$ and that the bias voltage $V_B$ has been selected to be larger than the detection level voltage $V_{TH}$.

As apparent from FIG. 2(a), in the ADC of FIG. 1, the voltage V at the input terminal of the capacitor 105 becomes negative, when the SW108 is turned off and the SW107 is turned on, because the bias voltage $V_B$ is larger than the detection level voltage $V_{TH}$. Assume that the circuit is formed by n-channel MOSIC, the pn junctions between the drain regions of the OFF state switches 102, 103, 104 and the substrate have a forward bias, when the voltage V at the input terminal of the capacitor 105 is negative. Consequently, the circuit may be broken or may have an extraordinary action.

In order to avoid this phenomenon, the switches 104 and 107 may be simultaneously turned on to put both the terminals of the capacitor 105 at the zero potential, or ground voltage after the switch 108 is turned off. However, the possibility of IC break down is still high, since it is difficult to obtain such a conincidence.

A detailed description of this invention, hereinafter, will be made with reference to the drawings.

In FIG. 3, the same reference numerals as in FIG. 1 denote the same elements. Reference numeral 301 denotes an input terminal, to which an analog input signal is applied, numeral 303 denotes a switch, from which the analog input signal is applied to a storage means 305, and 306 denotes a bias voltage supply means, which is constructed by a switch 307, a switch 308 and a bias voltage source 309. Reference numeral 315 denotes a switch which is newly added in parallel with the storage means 305, for short-circuiting both the terminals of the storage means 305.

In this embodiment, the switch 315 is turned on to recover the voltage V at the input terminal of the storage means 305 to the bias voltage $V_B$, when the voltage V drops to the detection level voltage $V_{TH}$ of the level detecting circuit 111.

This operation is minutely explained with reference to FIG. 4. FIG. 4(a) shows the voltage V at the input terminal of the storage means 305, FIG. 4(b) shows the ON and OFF states of the switch 303, FIG. 4(c) shows the operational state of the discharging circuit 110, FIGS. 4(d), 4(e) and 4(f) show the ON and OFF states of the switches 307, 308 and 315, respectively, and FIG. 4(g) shows clock pluses counted by the counter 112.

Firstly, a charge corresponding to the analog input signal is stored in the storage means 305 and the voltage V at the input terminal thereof becomes the voltage $V_I$ under the ON states of the switches 303 and 307. Subsequently, concurrently with turning off the switches 303 and 307, the switch 308 is turned on, the operation of the discharge circuit 110 of a constant current type is initiated to discharge the change stored in the storage means 305, and the counter 112 is set. At the beginning of discharging, the voltage V at the input terminal of the storage means 305 is $V_I + V_B$. At the same time, the condition that bias voltage $V_B >$ detection level voltage $V_{TH}$ permits the level detecting circuit 111 to deliver the output of "1" level which causes the counter 112 to count clock pulses for a period. This period varies with the magnitude of voltage $V_I$. After the initiation of discharging, the voltage V at the input terminal of the storage means 305 gradually decreases from $V_I + V_B$ to the detection level voltage $V_{TH}$ and eventually, at $V_{TH}$, the output of level detecting circuit 111 is inverted from "1" level to "0" level. Concurrently therewith, the discharging circuit 110 is turned off, causing the counter 112 to terminate its counting of the clock pulses as shown in FIG. 4(g). At the termination, according to the invention, the switch 315 is turned on to recover the voltage V at the input terminal of the storage means 305 up to $V_B$. In other words, the switch 315 short-circuits both the terminals of the storage means 305. After a lapse of time, the switch 307 is turned on along with simultaneous turning off of the switch 308 so that the voltage V at the input terminal of the storage means 305 falls to zero, thus completing one cycle of the A-D conversion according to the invention. As will be seen from FIG. 4(a), according to the invention, the voltage V at the input terminal of the storage means 305 never falls below zero voltage. Accordingly, even when the invention is materialized in the form of an IC by using n-channel MOSFET's, it is completely freed from the breakdown of the IC. When considering the inversion of the voltage polarity, the above advantage is valid for the formation of IC by using p-channel MOSFET's.

While the foregoing embodiment was explained by way of the constant current type discharging circuit 110, a discharging circuit of an exponential slope type may obviously be used.

A concrete example of $V_B$, $V_{TH}$, and $V_I$ will be briefly described here. When the level detection circuit 111 is constituted by multistage connections of inverters, $V_{TH}$ may be set at 0.5 V to 1.5 V. If $V_{TH}$ is set around 1.3 V and the bias voltage $V_B$ is set around 2.0

V, all the input signal voltage $V_I$ above 0 (zero) V can be A-D converted.

Figure 5:
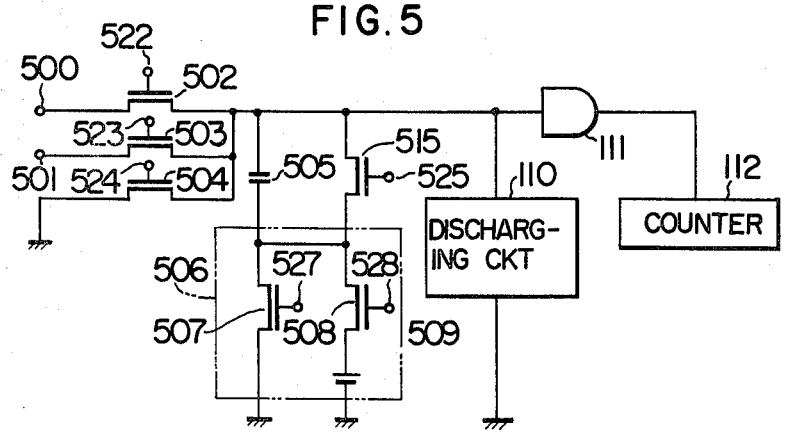
FIG. 5 shows the schematic circuit of another embodiment of this invention.

FIG. 5 shows another embodiment of this invention. In this Figure, the same reference numerals as in FIG. 1 and FIG. 3 denote the same elements. Referring to FIG. 5, reference numerals 501 and 500 denote input terminals, to which an analog input signal and a reference voltage are applied, respectively. Reference numerals 502, 503 and 504 denote switches made of MOSFET's for connecting the reference voltage, analog input signal and ground voltage. A bias voltage supply means generally denoted by 506 includes MOSFET switches 507 and 508 and a source 509 of bias voltage $V_B$. A MOSFET switch 515 is adapted to short-circuit the capacitor 505. Control terminals 522, 523, 524, 527, 528 and 525 are supplied with pulses for controlling the gates of MOSFET switches 502, 503, 504, 507, 508 and 515, respectively.

In this embodiment, assuming that the count values of counter 112 are $N_{RC}$, $N_{IC}$ and $N_{OC}$ for the reference voltage $V_R$, the input signal voltage $V_I$ and the zero voltage $V_O$ respectively the following equation holds.

$$V_I = V_O + (V_R - V_O) \cdot (N_{IC} - N_{OC})/(N_{RC} - N_{OC})$$

It is seen that the capacitance C of the capacitor 505 and the bias voltage $V_B$ do not appear in the above equation.

Accordingly, it is possible to obtain accurate digital values which are immune to variations in the capacitance C and bias voltage $V_B$.

Figure 6A:
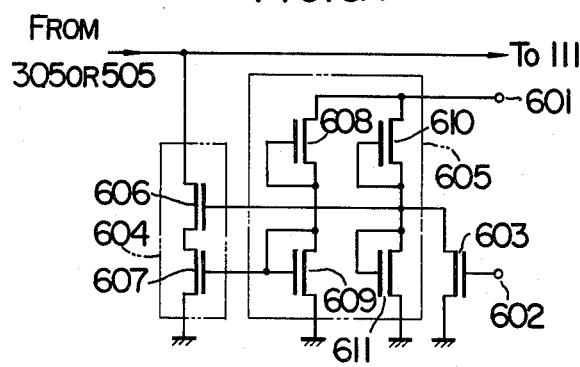
FIGS. 6A and 6B show circuit diagrams of the constant current discharging circuits shown in FIGS. 3 and 5.
Figure 6B:
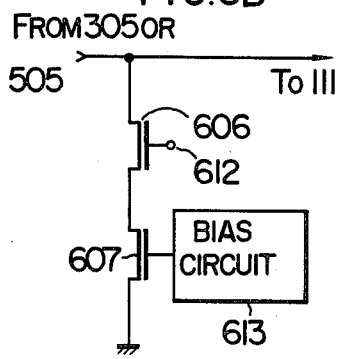

FIGS. 6A and 6B show examples of the constant current type discharge circuit. The construction of FIG. 6A is described in detail in the specification of Japanese patent application No. 87417/77. In FIG. 6A, 601 denotes a voltage $V_{DD}$ supply terminal, 602 a control terminal for applying a control pulse to switch 603 for the ON-OFF operation of the constant current circuit, 604 a constant current output circuit, and 605 a bias circuit for the constant current output circuit 604.

The constant current output circuit 604 comprises two enhancement type MOSFET's 606 and 607 connected in series between the output terminal and the ground. The bias circuit 605 serves to operate the enhancement type MOSFET's 606, and 607 in the saturation region, and is formed by a first voltage divider circuit comprising a depletion type MOSFET 608 and an enhancement type MOSFET 609 and a second voltage divider circuit comprising a depletion type MOSFET 610 and an enhancement type MOSFET 611.

The constant voltage of the first voltage divider circuit is applied to the gate of MOSFET 607, while that of the second voltage divider circuit is applied to the gate of MOSFET 606.

This constant current circuit utilizes basically the fact that the drain currents in the saturation region of the enhancement type MOSFET's 606 and 607 are substantially constant independent of the drain voltage. Furthermore, the fact that the drain currents of the MOSFET's 606 and 607 varies in the opposite direction to that of the voltage variation at the connection point of these MOSFET's to stabilize the drain voltage of MOSFET 607 always at a constant value, is also appreciated.

FIG. 6B shows another construction of the constant current discharging circuit. The gate voltage of an enhancement type MOSFET 607 is maintained constant by a bias circuit 613. Another enhancement type MOSFET 606 has an ON-OFF switch function for the constant current discharging circuit, in other words, is the discharging switch. 612 denotes a terminal for supplying the control pulse.

Figure 7:
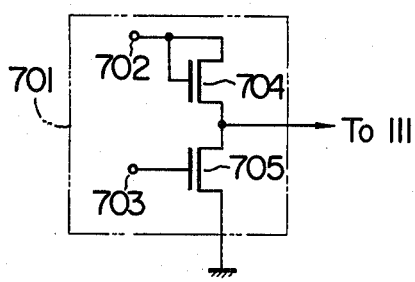
FIG. 7 shows a circuit diagram applying to a bias voltage supply means shown in FIGS. 3 and 5.

FIG. 7 shows another construction of the bias voltage supply means in FIG. 3 and FIG. 5. The bias voltage supply means 701 is realized by a conventional inverter of MOSFET's 704 and 705, with 702 and 703 being $V_{DD}$ supply and control terminals respectively. The potential difference between the low and high levels of the inverter corresponds to the bias voltage $V_B$. Namely, the inverter is at the low level at the charging period, while it is at the high level at the discharging period. Usually, the low level is grounded.

Furthermore, the level detection circuit 111 in FIGS. 3 and 5 is suitably built in an IC by a multiconnection of inverters, but analog comparators and operational amplifiers are also suitable.

Figure 8:
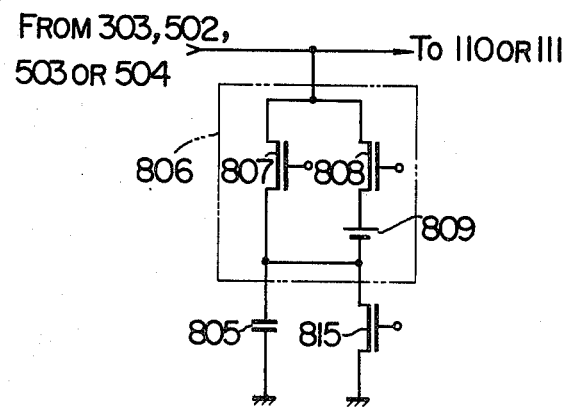
FIG. 8 shows a part of a circuit diagram of another embodiment of this invention.

Moreover, as the connection position of the bias voltage supply means, such a position as shown in FIG. 8 is also allowed. In FIG. 8, 806 denotes a bias voltage supply means, which is constructed by MOSFET's switches 807 and 808, and a bias voltage source 809, 805 denotes a capacitor, and 815 denotes a MOSFET's switch for short-circuiting both terminals of the capacitor 805. When taking the junction between MOSFET's switches 807 and 808 for the input terminal of the storage means, the foregoing descriptions of the embodiments with reference to FIGS. 3, 4 and 5 are also exactly descriptive of this circuit.

Well, some embodiments of this invention have been described in detail above. The methods and the constructions for solving the problem of fluctuation or long term variation of the bias voltage $V_B$ are mentioned in the afore-mentioned specification of U.S. patent application Ser. No. 887,966. Those methods and constructions can be also applied to the ADC of this invention.

Although not described in the above explanation, according to this invention, it is possible to control the operation of the bias voltage supply means depending on the characters of analog input signal to be A-D converted in such a way that the bias voltage supply means operates if the analog input signal voltage $V_I$ is smaller than the detection level voltage $V_{TH}$, while it does not operate if $V_I$ is larger than $V_{TH}$.

Furthermore, for constructing the ADC of this invention in an IC, a storage means or a capacitor and a bias voltage source may be external components of the IC.

We claim:

1. An analog-to-digital converter comprising:
   (a) a storage means with an input terminal, to which an analog signal is applied, for storing said analog input signal,
   (b) a discharging circuit coupled with said storage means for discharging the charge stored therein,
   (c) a level detection circuit connected to said input terminal of said storage means,
   (d) a counting means connected to said level detection circuit for counting the number of clock-pulses in the period of discharging,
   (e) a bias voltage supply means connected in series with said storage means, and
   (f) a short-circuiting means connected in parallel with said storage means.

2. An analog-to-digital converter according to claim 1, wherein said storage means is a capacitor, and a short-circuiting means is a switch.

3. An analog-to-digital converter according to claim 1 or 2, wherein said discharging circuit is a constant current discharging circuit.

4. An analog-to-digital converter according to claim 1 or 2, wherein said bias voltage supply means comprises a parallel circuit of a switch, and a series connection of a switch and a bias voltage source.

5. An analog-to-digital converter according to claim 1 or 2, wherein said level detection circuit comprises a multistage connection of inverters.

6. An analog-to-digital converter comprising:
   (a) an input terminal, to which an analog input signal is applied,
   (b) a storage means connected to said input terminal through a switch for storing said analog input signal,
   (c) a discharging circuit coupled with the storage means for discharging the charge stored therein,
   (d) a level detection circuit connected to the input terminal of said storage means and having a detection level,
   (e) a counter connected to said level detection circuit for counting the number of clock pulses in the period between the time at the start of discharge and the time when a voltage at said input terminal of said storage means reaches said detection level,
   (f) a bias voltage supply means connected in series with said storage means for supplying a vias voltage to said voltage at said input terminal of said storage means, and
   (g) a short-circuiting means connected in parallel with said storage means for short-circuiting said storage means at the time of finish of discharge.

7. An analog-to-digital converter according to claim 6, wherein said storage means is a capacitor and a short-circuiting means is a switch.

8. An analog-to-digital converter according to claim 7, wherein said bias voltage supply means comprises a parallel circuit of a switch, and a series connection of a switch and a bias voltage source.

9. An analog-to-digital converter according to claim 8, wherein all switches are MOSFET's.

10. An analog-to-digital converter according to claim 6; comprising another input terminal to which a reference voltage is applied and connected to said storage means through a switch.

11. An analog-to-digital converter according to claim 6; comprising a switch connected between ground and said storage means.

12. An analog-to-digital converter according to claim 11, wherein all switches are MOSFET's.

* * * * *